(12) United States Patent
Lim et al.

(10) Patent No.: US 6,170,077 B1
(45) Date of Patent: Jan. 2, 2001

(54) METHOD FOR ENCODING A DIGITAL COMMUNICATION CHANNEL

(75) Inventors: In Gi Lim; Seong Bong Lee; Kwang Il Yeon; Kyung Soo Kim, all of Daejeon (KR)

(73) Assignee: Electronics and Telecommunications Research Institute, Daejeon (KR)

( * ) Notice: Under 35 U.S.C. 154(b), the term of this patent shall be extended for 0 days.

(21) Appl. No.: 09/135,680

(22) Filed: Aug. 18, 1998

(30) Foreign Application Priority Data

Oct. 23, 1997 (KR) .................................................. 97-54545

(51) Int. Cl.[7] .................................................. H03M 13/03
(52) U.S. Cl. ........................................... 714/786; 714/763
(58) Field of Search ..................... 710/53, 130; 395/128; 365/189.01; 463/43; 714/786

(56) References Cited

U.S. PATENT DOCUMENTS

| 4,298,954 | * | 11/1981 | Bigelow et al. | 710/53 |
|---|---|---|---|---|
| 5,042,033 | | 8/1991 | Costa | 714/701 |
| 5,065,346 | * | 11/1991 | Kawai et al. | 395/128 |
| 5,103,459 | | 4/1992 | Gilhousen et al. | 370/209 |
| 5,163,132 | * | 11/1992 | DuLac et al. | 710/53 |
| 5,265,048 | * | 11/1993 | Kimura | 365/189.01 |
| 5,416,797 | | 5/1995 | Gilhousen et al. | 370/209 |
| 5,437,464 | * | 8/1995 | Terasima et al. | 463/43 |
| 5,502,822 | * | 3/1996 | Takebe | 710/130 |

* cited by examiner

Primary Examiner—Albert De Cady
Assistant Examiner—David Ton
(74) Attorney, Agent, or Firm—Cohen, Pontani, Lieberman & Pavane

(57) ABSTRACT

A method for encoding a digital communication channel is disclosed. The method includes the steps of first storing a frame data, which is inputted for a channel encoding operation, into an encoder RAM (ERAM0); second addressing the ERAM and storing the data into a register via a multiplexer in accordance with a control of a frame selection signal; third addressing the ERAM for reading the previous input data and storing the read data into the register; fourth selecting an input data among two register output data, inputting the selected input data into the convolutional encoder and generating a code symbol; and fifth selecting one among the code symbols and obtaining an output of the channel encoder that completed the convolutional encoding and interleaving operations.

5 Claims, 5 Drawing Sheets

METHOD FOR ENCODING A DIGITAL COMMUNICATION CHANNEL

BACKGROUND OF THE INVENTION

1. Field of the Invention

The present invention relates to a method for encoding a digital communication channel, and in particular, to an improved method for encoding a digital communication channel which is capable of enhancing the performance of a digital communication based on a convolutional encoding and interleaving technique.

2. Description of the Conventional Art

As shown in FIG. 1; the conventional method for encoding a digital communication channel includes a frame input data register 110 for receiving a frame data for implementing a channel encoding operation, a write address control circuit 120 for storing an input data into an ERAM (encoder RAM), a read address control circuit 130 for reading the data stored in the ERAM, an ERAM 140 for storing the frame data input, a parallel-serial converter 150 for reading a data from the ERAM and converting the data, a convolutional encoder 160 for receiving a serial input data and generating a code symbol, a write address control circuit 180 for controlling the code symbol generated for implementing an interleaving operation, an interleaver RAM (hereinafter called IRAM) 170 for storing a code symbol, and a read address control circuit 190 for reading the data from a boundary of the frame in a form of row at a predetermined time and implementing a channel encoding operation.

The data of one frame inputted through the frame input data register 110 are sequentially inputted into the ERAM 140 in accordance with the micro controller and the write address control circuit 120 for implementing a channel encoding operation.

The data stored in the ERAM are sequentially read at a predetermined time earlier than the time computed at the boundary of the next frame and are inputted into the convolutional encoder 160 through the parallel-serial converter 150 for thereby generating a code symbol, and then the code symbol generated for implementing the interleaving operation is stored into the IRAM 170 in accordance with a control of the write address control circuit 180, and the thusly stored data are read in a form of row at a predetermined time in accordance with a control of the read address control circuit 190 from the boundary of the frame for thereby implementing a channel encoding operation.

FIG. 2 illustrates a signal timing method for a conventional channel encoder which includes a step S1 in which a data request interrupt signal is received and a controller writes an input data into a frame input data register. In a step S2, the input data stored in the frame input data register are sequentially inputted into the ERAM 140. Thereafter, when the data of one frame are all inputted, the convolutional encoding operation becomes a ready state for an ERAM read time.

In the above described construction, the operation that the input data of one frame are buffered into the ERAM and then are read for thereby implementing a convolutional encoding operation is simply performed. In order to perform the interleaving operation, the data should be written into the IRAM within one frame time, and one frame should equally be divided and then the data stored in the IRAM is read at a predetermined time. In the conventional art, it is difficult to control the timing.

For implementing the above-described timing control, all of the data stored in the IRAM are written at a time between the final IRAM read time of the previous frame and the initial IRAM read time of the current frame, and the data used at the time when the data stored in the IRAM are read in a form of row are written into the IRAM. Namely, the above described IRAM write and read operations may be used. There is a limit in that the micro controller stores a frame input data into the register by avoiding the time when the data are read from the ERAM and then encoded. In addition, additional control operation is required for adjusting the position of a data request interrupt.

In Steps S3 and (FIG. 2) S4, the data stored in the ERAM are sequentially read at the boundary of the frame for a predetermined computed time, and the convolutional encoding operation is performed with respect to the first frame.

In Step S5, the code symbol from the convolutional encoder is sequentially stored into the IRAM from the first address.

The data read from the IRAM at the time which is obtained by equally dividing one frame at the boundary of the frame in Step S6 for thereby implementing a channel encoding operation of the initial frame, and then the input data of the second frame are received in Step S7, and the channel encoding operation of the second frame is performed in the same manner as the first frame.

Namely, in order to implement the channel encoder which used a convolutional encoding operation and an interleaving operation, the IRAM which is capable of implementing a large size by the inverse proportion of encoding rate R compared to the ERAM is required. Namely, a circuit and timing control circuit capable of generating an address for performing a write and read operation of the IRAM is required within one frame time.

In addition, it is impossible to write the frame input data into the frame input data register while the convolutional encoding operation is performed and the data stored in the ERAM are read by the micro controller. In addition, in order to overcome the above problem, the position of the data request interrupt should be adjusted for thereby additionally requiring a control operation.

SUMMARY OF THE INVENTION

Accordingly, it is an object of the present invention to provide a method for encoding a digital communication channel which overcomes the aforementioned problems encountered in the conventional art.

It is another object of the present invention to provide a method for encoding a digital communication channel which is capable of implementing a convolutional encoding and interleaving operation at a time by alternately using two RAMS for a frame input data buffering operation having a small size by the ratio of encoder rate R compared to the interleaver RAM without using an interleaver RAM having a large memory space and a high test cost compared to the conventional art which is directed to using a RAM for storing a frame data inputted for a channel encoding operation and another RAM for an interleaving operation of a code symbol which is an output of the convolutional encoder, thereby decreasing the number of hardware for a channel encoder and implementing a simple and a predetermined margin of a protocol when changing a micro controller and a frame input data packet.

In order to achieve the above objects, there is provided a method for encoding a digital communication channel which includes the steps of first storing a frame data, which is inputted for a channel encoding operation, into an encoder RAM (ERAM0); second addressing the ERAM and storing the data into a register via a multiplexer in accordance with a control of a frame selection signal; third addressing the ERAM for reading an input data before the previous input data and storing the read data into the register; fourth selecting an input data among two register output data, inputting the selected input data into the convolutional encoder and generating a code symbol; and fifth selecting one among the code symbols and obtaining an output of the channel encoder that completed the convolutional encoding and interleaving operations.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention will become more fully understood from the detailed description given hereinbelow and the accompanying drawings which are given by way of illustration only, and thus are not limiting of the present invention, and wherein.

DETAILED DESCRIPTION OF THE INVENTION

Figure 1:
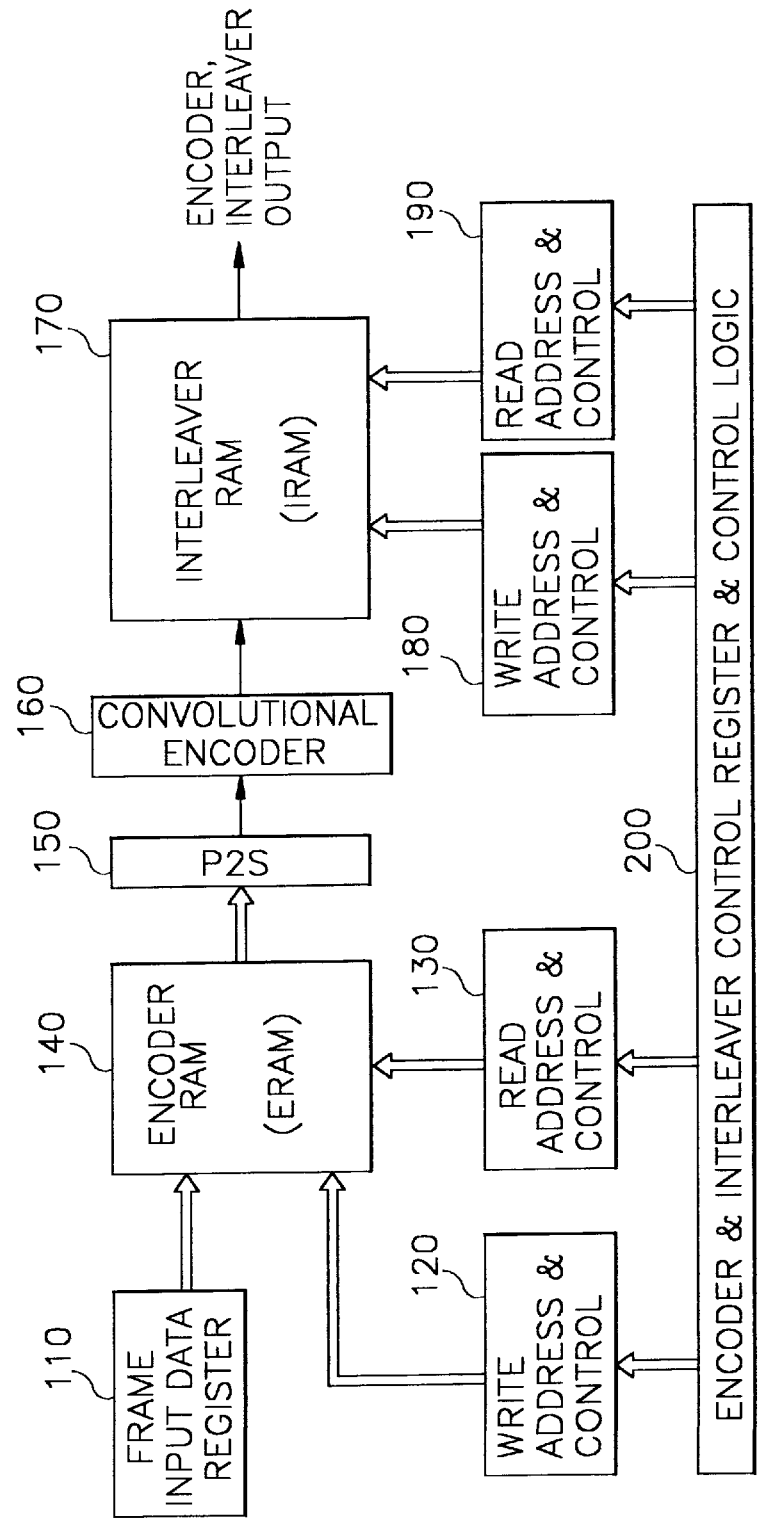
FIG. 1 is a block diagram illustrating a conventional channel encoder according to the present invention.
Figure 2:
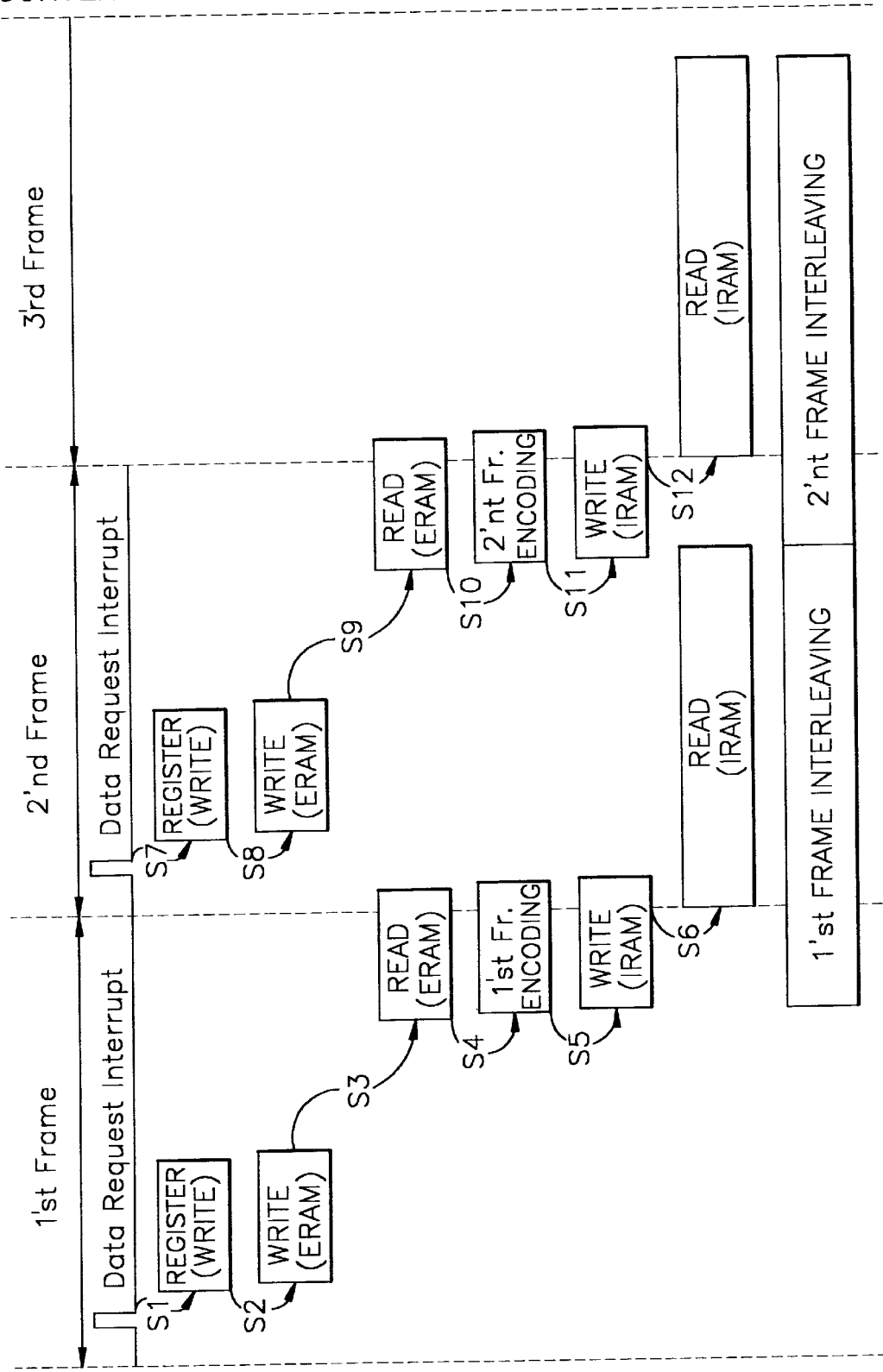
FIG. 2 is a view illustrating a timing signal flow for a conventional channel encoder.
Figure 3:
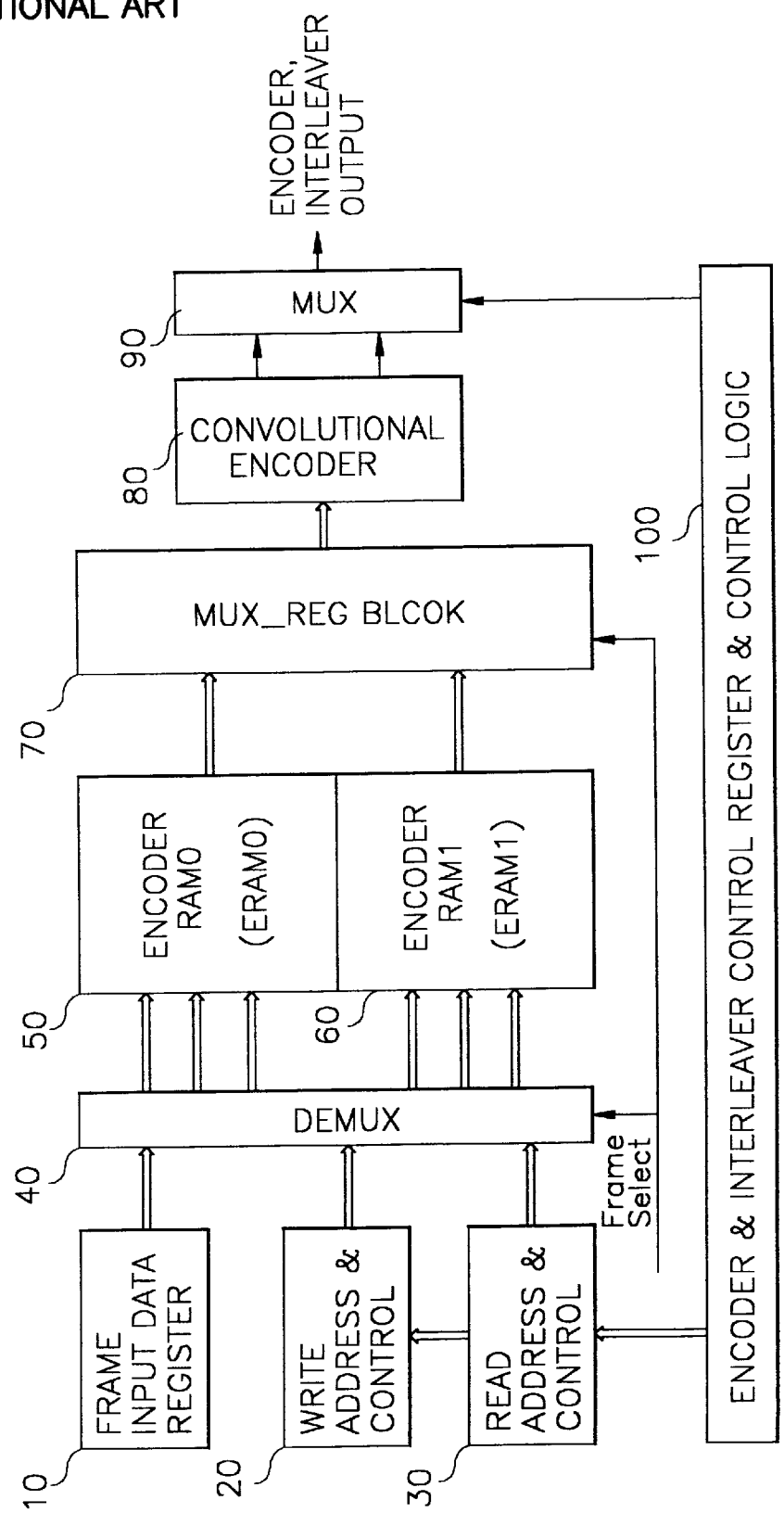
FIG. 3 is a block diagram illustrating a channel encoder according to the present invention.

FIG. 3 illustrates a channel encoder according to the present invention. Assuming that one frame is 20 msec, a constraint length (hereinafter called K) of a convolutional encoder is 9, an encoding rate R is ½, a frame input register is 8 bits in which the MSB is first processed, and an input data of one frame is 288 bits, 36×8 bit ERAM0 and ERAM1 are used. In the conventional art, 576 bit IRAM are used.

Figure 4:
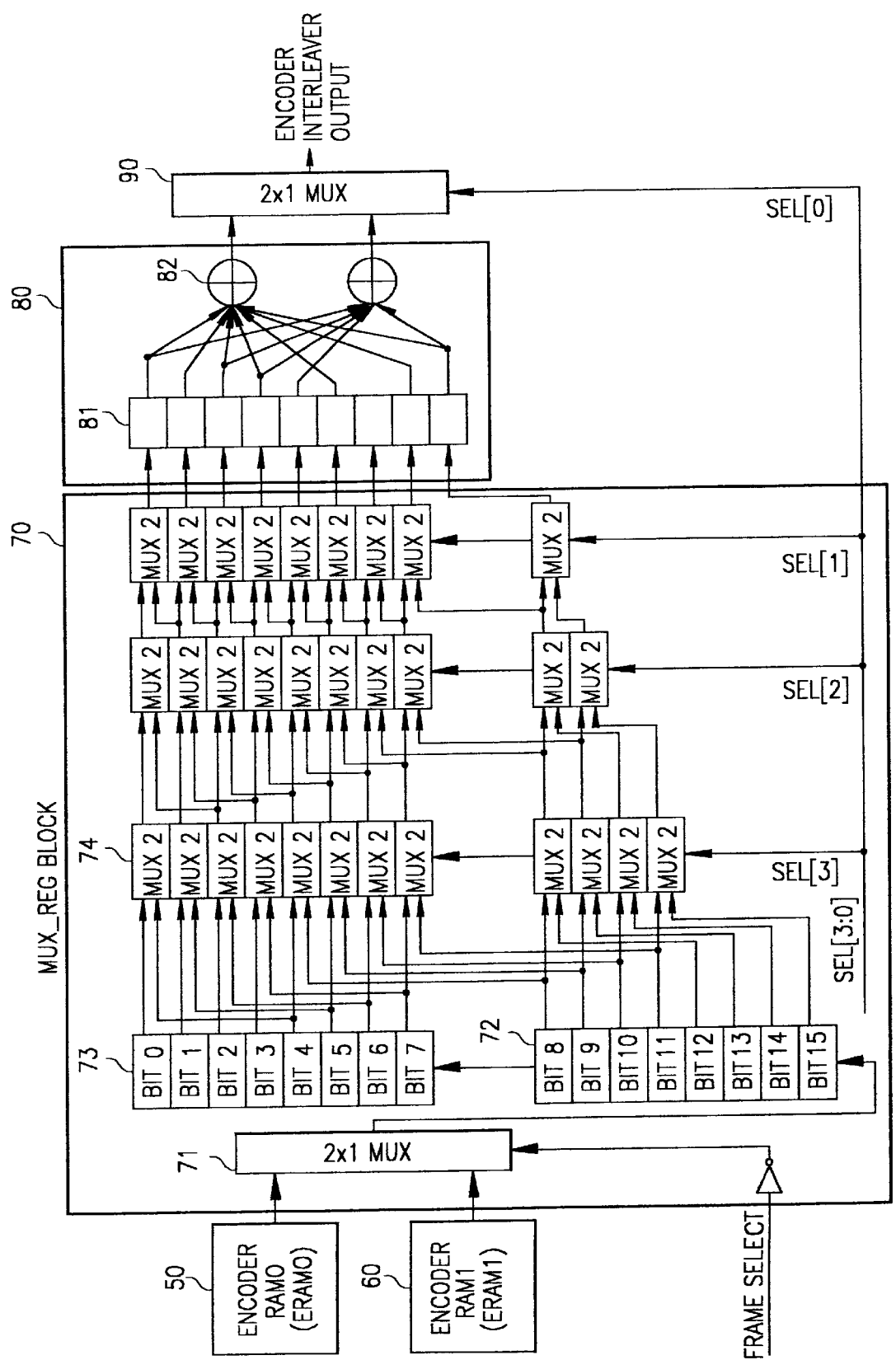
FIG. 4 is a block diagram illustrating a MUX_REG block according to the present invention.

As shown in FIGS. 3 and 4, one frame data inputted via the frame input data register 10 in accordance with a control of the micro controller are sequentially inputted into the ERAM 50 via the DEMUX 40 which is selected by the frame unit in accordance with a control of the write address control circuit 20.

In order to read the input data which generates a code symbol read based on an interleaving algorithm at the boundary of the second frame, the address of the ERAM containing an input data is computed, and the ERAM0 and ERAM1 are addressed. Thereafter, the data are stored into an 8 bit register 72 via a 2×1 multiplexer 71 in accordance with a frame selection signal.

In order to extract 8 input data inputted before the input data, the ERAM0 and ERAM1 are addressed using an address smaller than the address of the ERAM containing the input data, and the data are stored into the 8 bit register 72 via the 2×1 multiplexer 71 in accordance with a frame selection signal.

At this time, the data stored in the 8 bit register 72 shifted to the 8 bit register 73.

The bit 15 among the output of 16 bits of two 8 bit registers 72 and 73 is the data which is first inputted, and the bit 0 is the data which is last inputted. The input data which is necessary is one bit among 8 bit register 73. For example, if bit 3 is necessary, 9 bits of bit 4 through bit 11 including bit 3 should be selected.

12 bits are selected among 16 bits in accordance with a control of the SEL [3] and 12 2×1 multiplexers, 10 bits are selected among 12 bits in accordance with a control of the SEL [2] 10 2×1 multiplexers, and the final 9 bit is selected among 10 bits in accordance with a control of the SEL [1] and 9 2×1 multiplexers.

The data of 9 bits selected are in parallel into the register 81 of the convolutional encoder 80 as a desired input data and 8 previous input data for thereby generating two code symbols by a XOR gate 82.

When one code symbol is selected by the 2×1 multiplexer 90, it is possible to obtain an output of the channel encoder that completed the convolutional encoding and interleaving operations without using the interleaving RAM.

In this manner, the input data of the second frame are sequentially stored into the ERAM1 60 through the DEMUX 40, and the data are read from the ERAM1 at the boundary of the next frame for thereby performing the convolutional encoding and interleaving operations at one time.

FIG. 4 illustrates a MUX_REG block according to the present invention, which includes an 8 bit 2×1 multiplexer 71 for selecting 8 bit data by the frame unit among the 8 bit output data from two ERAMs, two 8 bit shift registers 72 and 73 for storing the output data from the ERAM which are twice accessed, and 31 2×1 multiplexers 74 for selecting a desired input data among the register output data of 16 bits and 8 input data which are previously inputted and inputting the selected data as a bit signal to the register 81 of the convolutional encoder.

Figure 5:
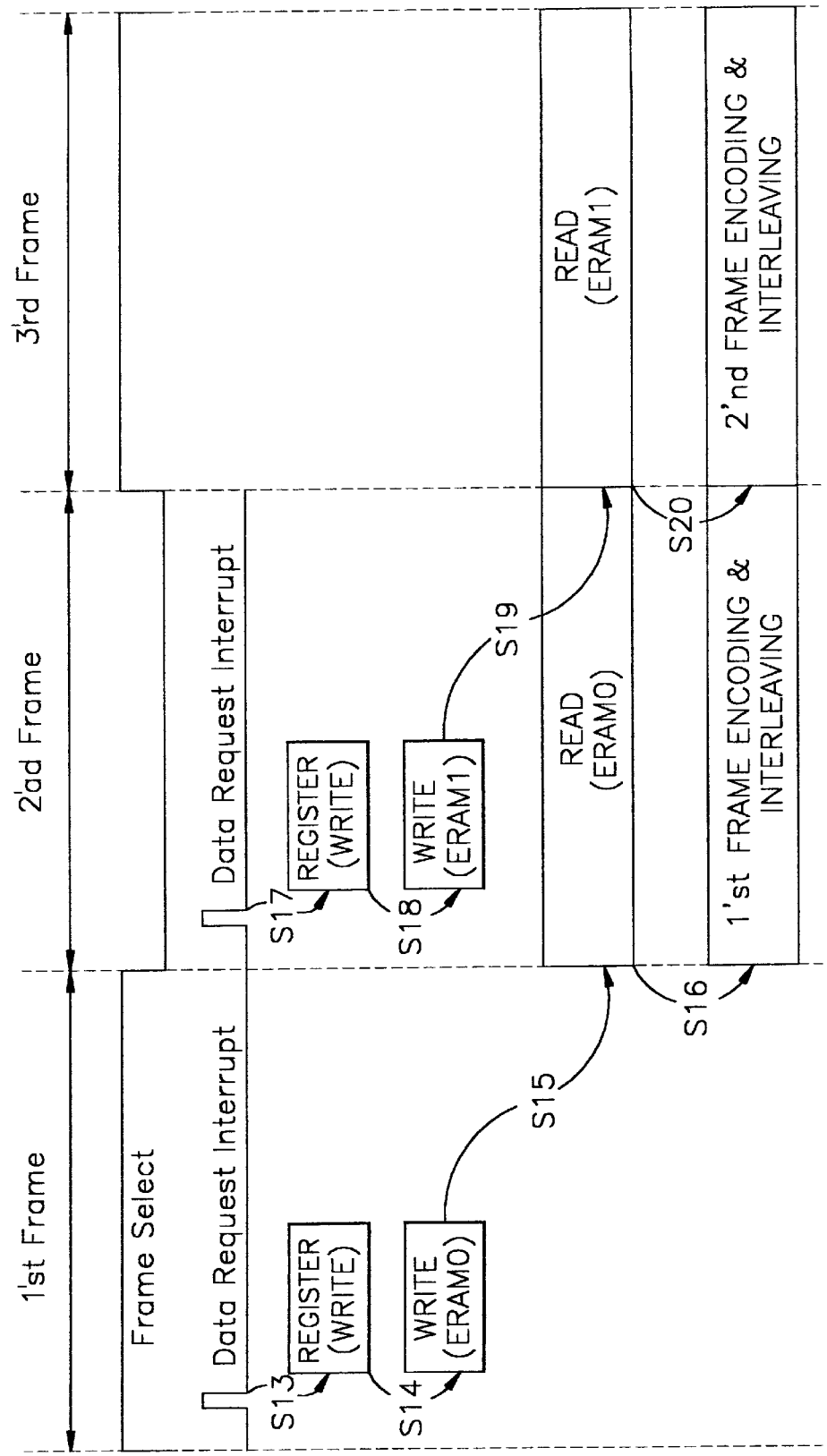
FIG. 5 is a view illustrating a timing of a channel encoder according to the present invention.

FIG. 5 is a view illustrating a timing of a channel encoder according to the present invention.

In Step S13, a data request interrupt is received from the first frame, and the micro controller writes the input data into the frame input data register.

In Step S14, when the data are written into the frame input data register, the data are selected alternately by the frame unit in accordance with a predetermined control and the data are sequentially written into ERAM0.

In Step S15, the data stored in the ERAM0 are read at every normalization based on the address computed with the interleaving algorithm, and in Step S16, the convolutional encoding and interleaving operations are completed at the same time.

In Step S17, the micro controller receives a data request interrupt while the convolutional encoding and interleaving operations for the first frame are performed at the same time and writes the second frame input data into the frame input data register.

Next, in Step S18, when the data are written into the frame input data register, the data are sequentially stored into the ERAM1 in accordance with a control by which the data are alternately selected.

In Step 19, the data stored in the ERAM1 are read at every normalization time in accordance with an address computed together with the interleaving algorithm at the boundary of the third frame, and in Step 20, the convolutional encoding and interleaving operations of the second frame are performed at the same time.

As shown in the timing diagrams, in the present invention, the problems encountered in the conventional art in which the micro controller does not store the input data into the frame input data register while the data stored in the ERAM are read and the convolutional encoding operation is performed at the same time are overcome by alternately writing the data by the frame unit using two ERAMs. Therefore, in the present invention, it is not necessary to control the operation that the position of the data request interrupt is adjusted, and the micro controller is able to access the frame input data register with a predetermined margin and enough time.

As described above, the problems of the conventional art in which the ERAM for buffering the frame data inputted for a channel encoding operation and the IRAM for implementing an interleaving operation are necessarily used are overcome in the present invention, whereby it is possible to enhance the simplicity of the protocol and a predetermined margin and decrease the number of hardware when changing the micro controller and the frame data packet alternately. This is accomplished using two smaller ERAMs and introducing a new channel encoding method which is capable of performing the convolutional and interleaving operations at one time without using the IRAM having a large size by the inverse proportion of encoding rate compared to the ERAM.

Although the preferred embodiments of the present invention have been disclosed for illustrative purposes, those skilled in the art will appreciate that various modifications, additions and substitutions are possible, without departing from the scope and spirit of the invention as recited in the accompanying claims.

What is claimed is:

1. A method for encoding a digital communication channel using a convolutional encoding and interleaving technique for enhancing the performance of a digital communication, comprising the steps of:
   (a) storing a frame data, which is inputted for a channel encoding operation, into encoder RAMs ERAM0 and ERAM1 via a demultiplexer selected at a predetermined period of the frame;
   (b) addressing the ERAMs and storing the data into register via a multiplexer in accordance with a control of a frame selection signal;
   (c) addressing the ERAMs for reading the previous data which is read and storing the read data into the register;
   (d) selecting an input data among two register output data, inputting the selected input data into the convolutional encoder and generating a code symbol; and
   (e) selecting one among the code symbols and obtaining an output of the channel encoder that completed the convolutional encoding and interleaving operations.

2. The method of claim 1, wherein step (b) further comprises:
   (b1) computing an address of the ERAM containing an input data for reading an input data generating a desired code symbol read based on the interleaving algorithm at a boundary of the second frame; and
   (b2) addressing the ERAM0 and ERAM1 by using the computed address and storing the data into an 8 bit register through a 2×1 multiplexer in accordance with a frame selection signal.

3. The method of claim 1, wherein step (c) further comprises:
   (c1) addressing the ERAM0 and ERAM1 using an address smaller than the address of the ERAM containing input data for reading 8 input data inputted before the input data which should be read; and
   (c2) storing the data which is addressed and read into the 8 bit register through the 2×1 multiplexer.

4. The method of claim 1, wherein step (d) further comprises:
   (d1) selecting input data and a plurality of input data which are previously inputted through a SEL and a plurality of multiplexers among 16 bit data of two 8 bit registers; and
   (d2) inputting in parallel a plurality of input data into the register of the convolutional encoder and generating a predetermined number of code symbols.

5. The method of claim 1, wherein step (e) obtains an output from the channel encoder that completed a convolutional encoding and interleaving operation without using an interleaving RAM by selecting one code symbol used for the code symbol.

* * * * *